US009911698B1

(12) United States Patent
Yang (10) Patent No.: US 9,911,698 B1
(45) Date of Patent: Mar. 6, 2018

(54) METAL ALLOY CAPPING LAYERS FOR METALLIC INTERCONNECT STRUCTURES

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/246,804

(22) Filed: Aug. 25, 2016

(51) Int. Cl.
*H01L 21/4763* (2006.01)
*H01L 23/532* (2006.01)
*H01L 21/768* (2006.01)
*H01L 23/528* (2006.01)

(52) U.S. Cl.
CPC .... *H01L 23/53238* (2013.01); *H01L 21/7685* (2013.01); *H01L 21/76843* (2013.01); *H01L 21/76862* (2013.01); *H01L 21/76864* (2013.01); *H01L 23/528* (2013.01); *H01L 23/53233* (2013.01)

(58) Field of Classification Search
CPC .......... H01L 21/5226; H01L 21/76825; H01L 23/528; H01L 21/28556; H01L 21/76862; H01L 21/14636; H01L 21/76828; H01L 21/76864; H01L 23/10; H01L 21/76883; H01L 16/0245
See application file for complete search history.

(56) References Cited

U.S. PATENT DOCUMENTS

| | | | | |
|---|---|---|---|---|
| 2006/0040487 A1* | 2/2006 | Inoue | ................... | C23C 18/1608 438/597 |
| 2006/0281299 A1* | 12/2006 | Chen | ................... | C23C 16/0245 438/622 |
| 2009/0309226 A1* | 12/2009 | Horak | ............... | H01L 21/76805 257/762 |
| 2010/0025852 A1* | 2/2010 | Ueki | ....................... | C23C 16/30 257/761 |
| 2010/0081276 A1* | 4/2010 | Ishizaka | ........... | H01L 21/02063 438/653 |
| 2010/0109155 A1* | 5/2010 | Liu | ................... | H01L 21/76825 257/734 |
| 2010/0248473 A1* | 9/2010 | Ishizaka | ........... | H01L 21/02063 438/659 |

* cited by examiner

*Primary Examiner* — A. Sefer
(74) *Attorney, Agent, or Firm* — Louis J. Percello; Ryan, Mason & Lewis, LLP (57) ABSTRACT

A semiconductor device is provided which comprises a metal interconnect structure having a metal alloy capping layer formed within a surface region of the metal interconnect structure, as well as methods for fabricating the semiconductor device. For example, a method comprises forming a metal interconnect structure in a dielectric layer, and applying a surface treatment to a surface of the metal interconnect structure to form a point defect layer in the surface of the metal interconnect structure. A metallic capping layer is then formed on the point defect layer of the metal interconnect structure, and a thermal anneal process is performed to convert the point defect layer into a metal alloy capping layer by infusion of metal atoms of the metallic capping layer into the point defect layer. The resulting metal alloy capping layer comprises an alloy of metallic materials of the metal capping layer and the metal interconnect structure.

16 Claims, 10 Drawing Sheets

METAL ALLOY CAPPING LAYERS FOR METALLIC INTERCONNECT STRUCTURES

TECHNICAL FIELD

This disclosure generally relates to semiconductor fabrication techniques and, in particular, techniques for fabricating metallic interconnect structures.

BACKGROUND

A semiconductor integrated circuit chip is typically fabricated with a back-end-of-line (BEOL) interconnect structure, which comprises multiple levels of metal wiring and inter-level metal vias, to connect various integrated circuit components and devices that are fabricated as part of a front-end-of-line (FEOL) layer of the semiconductor integrated circuit chip. Current state of the art BEOL process technologies typically implement copper to form BEOL interconnects, as the use of copper interconnects, as compared to conventional aluminum interconnects, are known to significantly reduce resistance in the BEOL interconnect structure, resulting in improved conduction and higher performance. As copper interconnect structures are scaled down, however, current density in the copper interconnect structures increases exponentially, resulting in current-driven electromigration of copper atoms. In the context of copper interconnect structures, electromigration is the transport of the copper material caused by the gradual movement of ions in the copper interconnect structures due to momentum transfer between conducting electrons and diffusing copper atoms. When copper interconnect structures undergo electromigration, the copper atoms can diffuse away from the copper interconnect structures and into other regions of the integrated circuit, thereby leading to various defects in the copper interconnect structure such as, for example, voids and hillock defects.

To mitigate electromigration in BEOL copper interconnect structures, a capping layer is typically formed over the BEOL copper wiring. The capping layer is formed with a material that serves to inhibit diffusion, oxidation, and/or electromigration from the top surface of the copper interconnect structures and/or to prevent oxidation of the copper interconnect structures. When forming a capping layer on a copper interconnect structure, however, the quality of the interface between the capping layer and the copper interconnect structure is extremely critical for purposes of preventing electromigration, because if there are too many impurities such as oxygen atoms, carbon atoms, etc. at the interface, there can be electromigration and unwanted reactions between the copper interconnect structure and the capping layer.

SUMMARY

Embodiments of the invention include a semiconductor device comprising a metal interconnect structure which comprises a metal alloy capping layer formed within a surface region of the metal interconnect structure, as well as methods for fabricating a metal alloy capping layer within a surface region of a metal interconnect structure. For example, one embodiment includes a method of forming a semiconductor device. The method comprises forming metal interconnect structure in a dielectric layer, wherein the metal interconnect structure comprises a first metallic material. A surface treatment is applied to a surface of the metal interconnect structure to form a point defect layer in the surface of the metal interconnect structure. A metallic capping layer is formed on the point defect layer of the metal interconnect structure, wherein the metallic capping layer comprises a second metallic material. A thermal anneal process is performed to convert the point defect layer into a metal alloy capping layer, wherein the metal alloy capping layer comprises an alloy of the first metallic material and the second metallic material. In one embodiment, the metal interconnect structure and the dielectric layer comprise an interconnect level of a BEOL structure of the semiconductor device.

In another embodiment, a surface treatment is applied to a surface of the dielectric layer to densify the surface of the dielectric layer. For example, the surface treatment is applied to the surface of the dielectric layer to convert a damaged surface layer of the dielectric layer into a densified surface layer by infusing atoms into the damaged surface layer of the dielectric layer.

In yet another embodiment, a single surface treatment is applied to concurrently densify the surface of the dielectric layer and to form a point defect layer in the surface of the metal interconnect structure.

Other embodiments will be described in the following detailed description of embodiments, which is to be read in conjunction with the accompanying figures.

BRIEF DESCRIPTION OF THE DRAWINGS

FIGS. 2 through 7 schematically illustrate a method for fabricating the semiconductor device of FIG. 1, according to an embodiment of the invention, wherein:

FIGS. 8 and 9 schematically illustrate a method for fabricating the semiconductor device of FIG. 1, according to another embodiment of the invention, wherein:

DETAILED DESCRIPTION

Embodiments will now be described in further detail with regard to semiconductor devices comprising a metal interconnect structure with a metal alloy capping layer formed within a surface region of the metal interconnect structure, as well as methods for fabricating a metal alloy capping layer within a surface region of a metal interconnect structure. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
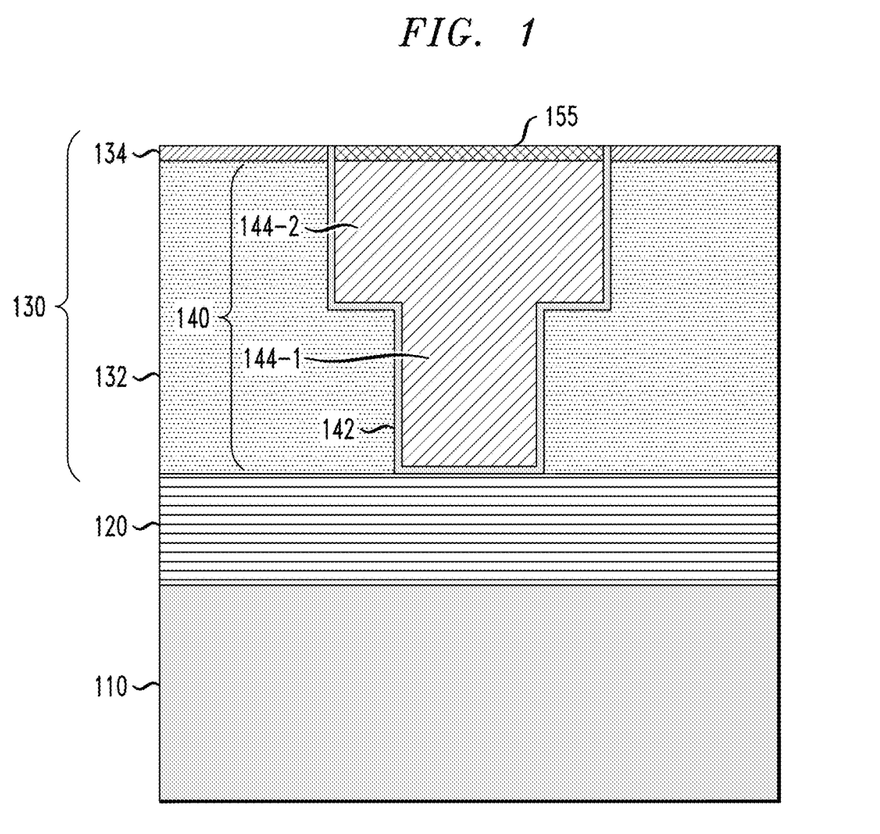
FIG. 1 is cross-sectional schematic view of a semiconductor device comprising a BEOL structure with a metal alloy capping layer formed within a surface region of a metal interconnect structure, according to an embodiment of the invention.

FIG. 1 is cross-sectional schematic view of a semiconductor device comprising a BEOL structure with a metal alloy capping layer formed within a surface region of a metal interconnect structure, according to an embodiment of the invention. In particular, FIG. 1 schematically illustrates a semiconductor device 100 comprising a substrate 110, a FEOL (front end of the line) and MOL (middle of the line) structure 120 (FEOL/MOL structure) formed on front side surface of the substrate 110, and a BEOL interconnect structure 130 formed on the FEOL/MOL structure 120. The BEOL interconnect structure 130 comprises an ILD (interlayer dielectric) layer 132, and a metal interconnect structure 140 embedded in the ILD layer 132. The metal interconnect structure 140 comprises a conformal liner layer 142, and a metal structure 144-1/144-2 comprising a metal via 144-1 and a metal line 144-2. The conformal liner layer 142 lines inner surfaces of an opening (e.g., dual damascene opening) that is patterned in the ILD layer 132. The conformal liner layer 142 serves as barrier diffusion layer to prevent migration of the metallic material (e.g., copper) of the metal via 144-1 and the metal line 144-2 (e.g., Cu) into the dielectric material of the ILD layer 132, as well as an adhesion layer to provide good adhesion to the metallic material (e.g., Cu) that is used to form the metal via 144-1 and the metal line 144-2.

As further shown in FIG. 1, an upper surface portion of the ILD layer 132 comprises a densified layer 134 which is formed using a controlled surface treatment. As explained in further detail below, in one embodiment of the invention, a controlled surface treatment is performed to convert an upper surface of the ILD layer 132, which is chemically damaged from a planarization process, into the densified layer 134. The densified layer 134 is formed by infusing atoms (e.g., Si, C, N, H, and/or O atoms) into the surface of the ILD layer 132, at a controlled depth using surface treatment methods that will be discussed in further detail below with reference to FIG. 5.

The densification of the upper surface of the ILD layer 132 serves to improve a TDDB (time-dependent dielectric breakdown) reliability of BEOL interconnect structure 130. For example, low-k TDDB is commonly considered a critical issue because low-k materials generally have weaker intrinsic breakdown strength than traditional $SiO_2$ dielectrics. In general, TDDB refers to the loss of the insulating properties of a dielectric when it is subjected to voltage/current bias and temperature stress over time. TDDB causes an increase in leakage current and, thus, degrades performance in nano-scale integrated circuits. The densification of the upper surface of the ILD layer 132 serves to improve the TDDB reliability of the ILD layer 132 and the BEOL interconnect structure 130.

As further shown in FIG. 1, the metal interconnect structure 140 comprises a metal alloy capping layer 155 formed within an upper surface region of the metal interconnect structure 140, in particular, in an upper surface of the metal wire 144-2. The metal alloy capping layer 155 serves to inhibit diffusion, oxidation, and/or electromigration from the top surface of the metal interconnect structure 140 and/or to prevent oxidation of the upper surface of the metal interconnect structure 140. The metal alloy capping layer 155 serves to reduce the demand on the quality of the interface (e.g., oxygen free, low amount of carbon, etc.) between the upper surface of the metal interconnect structure 140 and a metal capping layer, as would be required in a conventional structure to minimize or prevent electromigration.

In one embodiment of the invention, the metal alloy capping layer 155 is formed by a process which comprises applying a surface treatment to the surface of the metal interconnect structure 140 to form a point defect layer in the upper surface region of the metal interconnect structure 140, depositing a metal capping layer (e.g., layer 160, FIG. 6) on the metal interconnect structure 140, and performing a thermal anneal process to convert the point defect layer into the metal alloy capping layer 155 by infusion of metallic material from the metallic capping layer into the point defect layer of the metal interconnect structure 140. The resulting metal alloy capping layer 155 that is formed comprises an alloy of the metallic material (e.g., copper) of the metal interconnect structure 140 and the metallic material of the metallic capping layer. In one embodiment, the metal capping layer can be removed, wherein the metal alloy capping layer 155 effectively serves as a metallic capping layer embedded in the upper surface of the metal interconnect structure 140.

Figure 2:
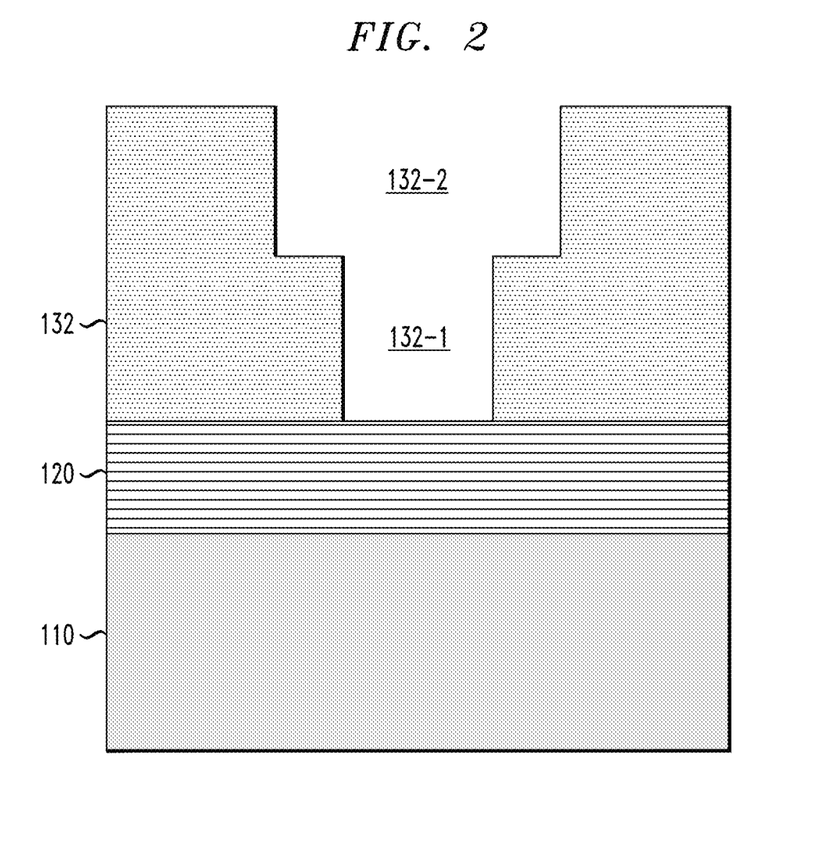
FIG. 2 schematically illustrates the semiconductor device of FIG. 1 at an intermediate stage of fabrication after etching an opening in an interlayer dielectric layer of the BEOL structure.

Various alternative methods for fabricating the semiconductor device 100 of FIG. 1 will now be discussed in further detail with reference to FIGS. 2 through 10. For example, FIGS. 2 through 7 schematically illustrate different stages of a process flow for fabricating the semiconductor device 100 of FIG. 1, according to an embodiment of the invention. To begin, FIG. 2 schematically illustrates the semiconductor device 100 of FIG. 1 at an intermediate stage of fabrication after etching an opening 132-1/132-2 in the ILD layer 132 of the BEOL interconnect structure 130. In particular, FIG. 2 illustrates an intermediate structure in which the FEOL/MOL structure 120 is formed on the semiconductor substrate 110, and the ILD layer 132 is deposited on the FEOL/MOL structure 120 and patterned to form a damascene opening comprising a via opening 132-1 and a trench 132-2.

The semiconductor substrate 110 is illustrated as a generic substrate layer, and may comprise different types of substrate structures. For example, in one embodiment, the semiconductor substrate 110 may comprise a bulk semiconductor substrate formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 may comprise a SOI (silicon on insulator) substrate, which comprises an insulating layer (e.g., oxide layer) disposed between a base substrate layer (e.g., silicon substrate) and an active semiconductor layer (e.g., active silicon layer) in which active circuit components (e.g., field effect transistors) are formed as part of a FEOL layer.

In particular, the FEOL/MOL structure 120 comprises a FEOL layer formed on the substrate 110. The FEOL layer comprises various semiconductor devices and components that are formed in or on the active surface of the semiconductor substrate 110 to provide integrated circuitry for a target application. For example, the FEOL layer comprises FET devices (such as FinFET devices, planar MOSFET device, etc.), bipolar transistors, diodes, capacitors, inductors, resistors, isolation devices, etc., which are formed in or on the active surface of the semiconductor substrate 110. In general, FEOL processes typically include preparing the substrate 110 (or wafer), forming isolation structures (e.g., shallow trench isolation), forming device wells, patterning gate structures, forming spacers, forming source/drain regions (e.g., via implantation), forming silicide contacts on the source/drain regions, forming stress liners, etc.

The FEOL/MOL structure 120 further comprises a MOL layer formed on the FEOL layer. In general, the MOL layer comprises a PMD (pre-metal dielectric layer) and conductive contacts (e.g., via contacts) that are formed in the PMD layer. The PMD layer is formed on the components and devices of the FEOL layer. A pattern of openings is formed in the PMD layer, and the openings are filled with a conductive material, such as tungsten, to form conducive via contacts that are in electrical contact with device terminals (e.g., source/drain regions, gate contacts, etc.) of the integrated circuitry of the FEOL layer. The conductive via contacts of the MOL layer provide electrical connections between the integrated circuitry of the FEOL layer and a first level of metallization of the BEOL structure 130.

The BEOL interconnect structure 130 is formed on the FEOL/MOL structure 120 to connect the various integrated circuit components of the FEOL layer. As is known in the art, a BEOL structure comprises multiple levels dielectric material and levels of metallization embedded in the dielectric material. The BEOL metallization comprises horizontal wiring, interconnects, pads, etc., as well as vertical wiring in the form of conductive vias that form connections between different interconnect levels of the BEOL structure. A BEOL fabrication process involves successive depositing and patterning of multiple layers of dielectric and metallic material to form a network of electrical connections between the FEOL devices and to provide I/O connections to external components.

In the example embodiment of FIG. 2, the ILD layer 132 is formed as part of a first interconnect layer of the BEOL interconnect structure 130. The ILD layer 132 may comprise any suitable dielectric material that is commonly utilized in BEOL process technologies. For example, the ILD layer 132 can be formed of a dielectric material including, but not limited to, silicon oxide (e.g. SiO2), silicon nitride (e.g., (Si3N4), hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). The ILD layer 132 may be deposited using known deposition techniques, such as, for example, ALD (atomic layer deposition), CVD (chemical vapor deposition) PECVD (plasma-enhanced CVD), or PVD (physical vapor deposition), or spin-on deposition. The thickness of the ILD layer 132 will vary depending on the application, and may have a thickness in a range of about 30 nm to about 200 nm, for example.

The ILD layer 132 can be patterned using known damascene techniques to form the opening 132-1/132-2 in the ILD layer 132. The example embodiment of FIG. 2 illustrates one method for patterning the via opening 132-1 and the trench opening 132-2 in a single layer of dielectric material (i.e., the ILD layer 132) using one of various "dual" damascene patterning techniques known in the art. In particular, such dual damascene techniques generally include a "via first" process, a "trench first" process, and a "buried via" process, which comprises different sequences for etching the ILD layer 132 and patterning the via opening 132-1 and trench opening 132-2, but where each type of dual damascene process results in the semiconductor structure shown in FIG. 2.

While illustrative embodiments for forming metal alloy capping layers in BEOL interconnect structures are described herein in the context of dual damascene techniques, it is to be understood that illustrative embodiments for forming metal alloy capping layers can be implemented in BEOL interconnect structures that are formed using single damascene techniques. With a single damascene process, metal vias and metal wiring are separately formed in different ILD layers. The damascene patterning process can be implemented using any conventional photolithography and etching process, e.g., forming a photoresist mask and etching the dielectric material of the ILD layer using a dry etch process such as RIE (reactive ion etching), etc.

Figure 3:
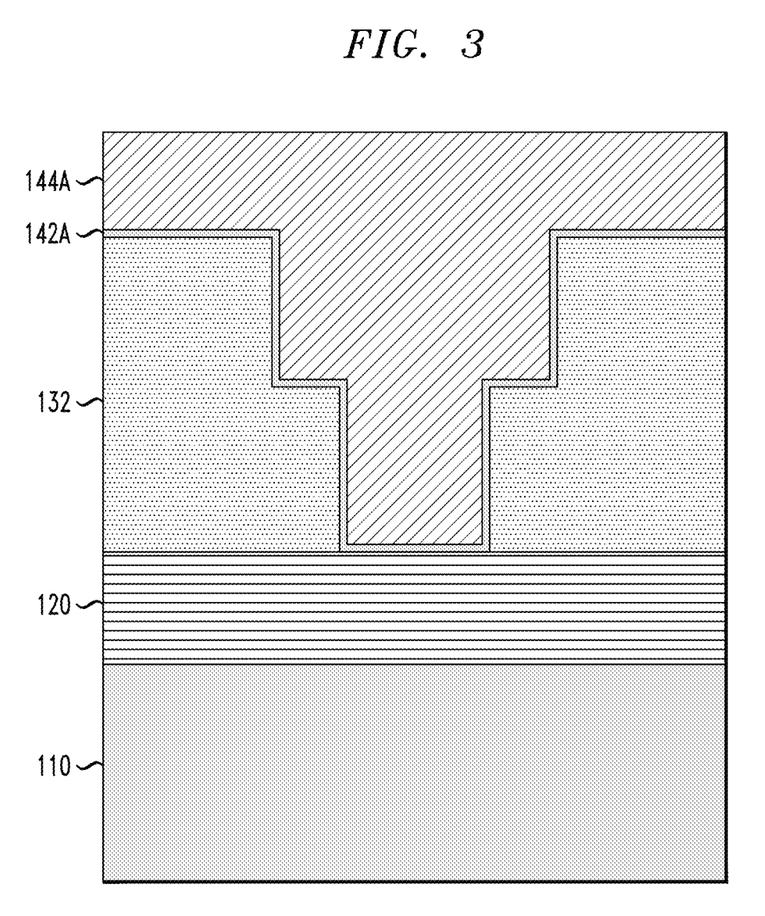
FIG. 3 is cross-sectional schematic side view of the semiconductor structure of FIG. 2 after sequentially depositing a conformal layer of liner material and a layer of metallic material to fill the opening in the interlayer dielectric layer.
Figure 4:
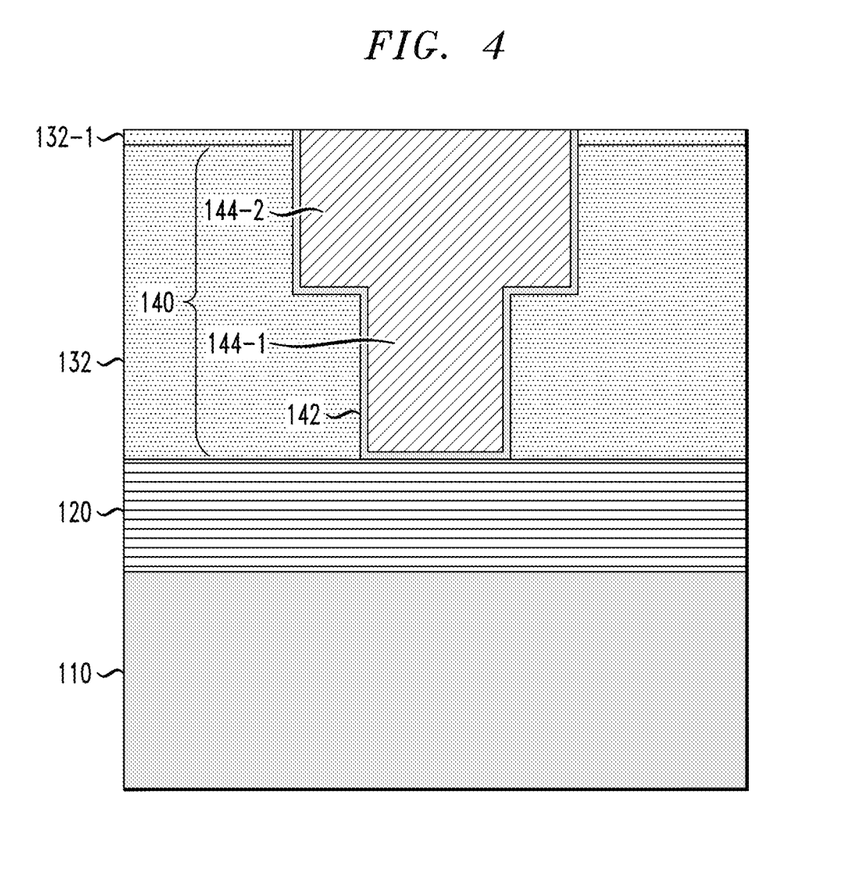
FIG. 4 is cross-sectional schematic side view of the semiconductor structure of FIG. 3 after planarizing the surface of the semiconductor structure to form a metal interconnect structure in the interlayer dielectric layer.

A next phase in the fabrication process comprises forming a metal interconnect structure in the ILD layer 132, using a process flow as schematically illustrated in FIGS. 3 and 4. In particular, FIG. 3 is cross-sectional schematic side view of the semiconductor structure of FIG. 2 after sequentially depositing a conformal layer of liner material 142A and a layer of metallic material 144A to fill the opening 132-1/132-2 in the ILD layer 132. In particular, as shown in FIG. 3, the conformal layer of liner material 142A is deposited to line the sidewall and bottom surfaces of the opening 132-1/132-2 in the ILD layer 132 with a thin liner. The liner material may include one or more thin layers of material such as, for example, tantalum (Ta), tantalum nitride (TaN), titanium nitride (TiN), cobalt (Co), ruthenium (Ru), tungsten (W), tungsten nitride (WN), titanium-tungsten (TiW), tungsten nitride (WN) manganese (Mn), manganese nitride (MnN) or other liner materials (or combinations of liner materials) such as RuTaN, Ta/TaN, CoWP, NiMoP, NiMoB) which are suitable for the given application. As noted above, the thin liner layer serves as a barrier diffusion layer and adhesion layer. The conformal layer of liner material 142A is deposited using known techniques such as CVD, ALD, PVD, etc.

Moreover, in one embodiment of the invention, the layer of metallic material 144A comprises copper (Cu). In other embodiments, the metallic material 144A comprises a metallic material such as, but not limited to, aluminum (Al), tungsten (W), cobalt (Co), ruthenium (Ru), iridium (Ir), rhodium (Rh), nickel (Ni), or alloys thereof. The layer of metallic material 144A is deposited using known techniques such as electroplating, electroless plating, CVD, PVD, or a combination of methods. Prior to depositing the layer of conductive material 144A, a thin seed layer (e.g., Cu seed layer) may optionally be deposited (on the conformal liner layer 142A) using a suitable deposition technique such as ALD, CVD or PVD. The seed layer can be formed of a material which enhances adhesion of the metallic material on the underlying material and which serves as catalytic material during a subsequent plating process. For example, a thin conformal Cu seed layer can be deposited over the surface of liner layer 142A using PVD, followed by the electroplating of Cu to fill the dual damascene opening 132-1/132-2, resulting in the semiconductor structure of FIG. 3.

The overburden liner, seed, and metallization materials are then removed by performing a chemical mechanical polishing process (CMP) to planarize the surface of the semiconductor structure down to the ILD layer 132, resulting in the semiconductor structure shown in FIG. 4. In particular, FIG. 4 is cross-sectional schematic side view of the semiconductor structure of FIG. 3 after planarizing the surface of the semiconductor structure to form the metal interconnect structure 140 in the ILD layer 132. As discussed above, the metal interconnect structure 140 comprises vertical conductive via 144-1 (or metal plug) and a metal wire 144-2 (or metal line). The metal wire 144-2 routes electrical signals (or DC power) between different locations on the semiconductor device. The vertical conductive via 144-1 connects the overlying metal wire 144-2 to an underlying wire of a lower BEOL interconnect level or to a contact of the underlying MOL layer of the FEOL/MOL structure 120.

As further shown in FIG. 4, a portion 132-1 of an upper surface of the ILD layer 132 is damaged as a result of the previous CMP planarizing process. In particular, depending on the type of dielectric material of the ILD layer 132 and the chemistry of the slurry used for the CMP planarization process, the upper surface of the ILD layer 132 can be chemically damaged, resulting in a damaged portion 132-1 of ILD material in the upper surface of the ILD layer 132. For example, when the ILD layer 132 comprises a low-k dielectric material comprising carbon (e.g., SiCNH), the CMP planarization process can result in the removal of carbon atoms from the dielectric material in the upper surface region of the ILD layer 132.

A next stage in the fabrication process comprises applying a controlled surface treatment to the surface of the semiconductor structure shown in FIG. 4 to densify the upper surface portion of the ILD layer 132 and to form "point defects" in the metallic material of the upper surface of the metal wire 144-2, wherein the point defects facilitate the interaction between the metallic material of the metal wire 144-2 and a subsequently deposited metallic material of a capping layer to form a metal alloy capping layer comprising a combination of the metallic materials of the metal wire 144-2 and the metal capping layer. For example, FIG. 5 is cross-sectional schematic side view of the semiconductor structure of FIG. 4, which shows a controlled surface treatment 200 being applied to the surface of ILD layer 132 and the exposed surface of the metal interconnect structure 140 to form a densified layer 134 in the upper surface of the ILD layer 132 and to form a layer of point defects 150 in the upper surface of the metal wire 144-2 of the metal interconnect structure 140.

More specifically, the controlled surface treatment 200 serves multiple purposes. For example, the control surface treatment 200 is applied to upper surface of the ILD layer 132 to convert the upper surface (e.g., the damaged surface layer 132-1) of the ILD layer 132 into the densified surface layer 134 of the ILD layer 132 by the infusion of one or more different types of atoms into the dielectric material at the upper surface of the ILD layer 132. The infused atoms may include, but are limited to, Si, C, N, H, and/or O, etc. The infusion of the atoms serves to densify the surface of the ILD layer 132 by, e.g., adding atoms to replace the depleted atoms (e.g., C) in the damaged surface layer 132-1, or otherwise fix the chemical damage caused to the upper surface of the ILD layer 132 by virtue of the previous CMP planarizing process. The densified surface layer 134 may comprise higher concentrations of the infused atoms as would be found in the bulk material of the ILD layer 132. In one embodiment, the densified surface layer 134 of the ILD layer 132 has a thickness in a range of about 1 nm to about 3 nm.

In addition, the controlled surface treatment 200 is applied to exposed upper surface of the metal interconnect structure 140 to form point defects in the metallic material in the upper surface portion of the metal wire 144-2. In general, the term "point defect" refers to some imperfection in the crystal lattice structure of a given material. A point defect may be a missing atom or ion that creates a vacancy in the lattice structure, or an extra atom or ion between two normal lattice points creating an interstitial point defect. In particular, vacancies are empty spaces in a lattice structure where atoms should be, but are missing, leaving empty lattice sites. In one embodiment, the controlled surface treatment 200 is applied to create vacancy point defects in the exposed upper surface of the metal interconnect structure 140, thereby forming the thin point defect layer 150. In one embodiment of the invention, the point defect layer 150 is formed with a thickness in a range of about 1 nm to about 3 nm, and has a substantially uniform concentration of vacancy point defects throughout the point defect layer 150.

Figure 5:
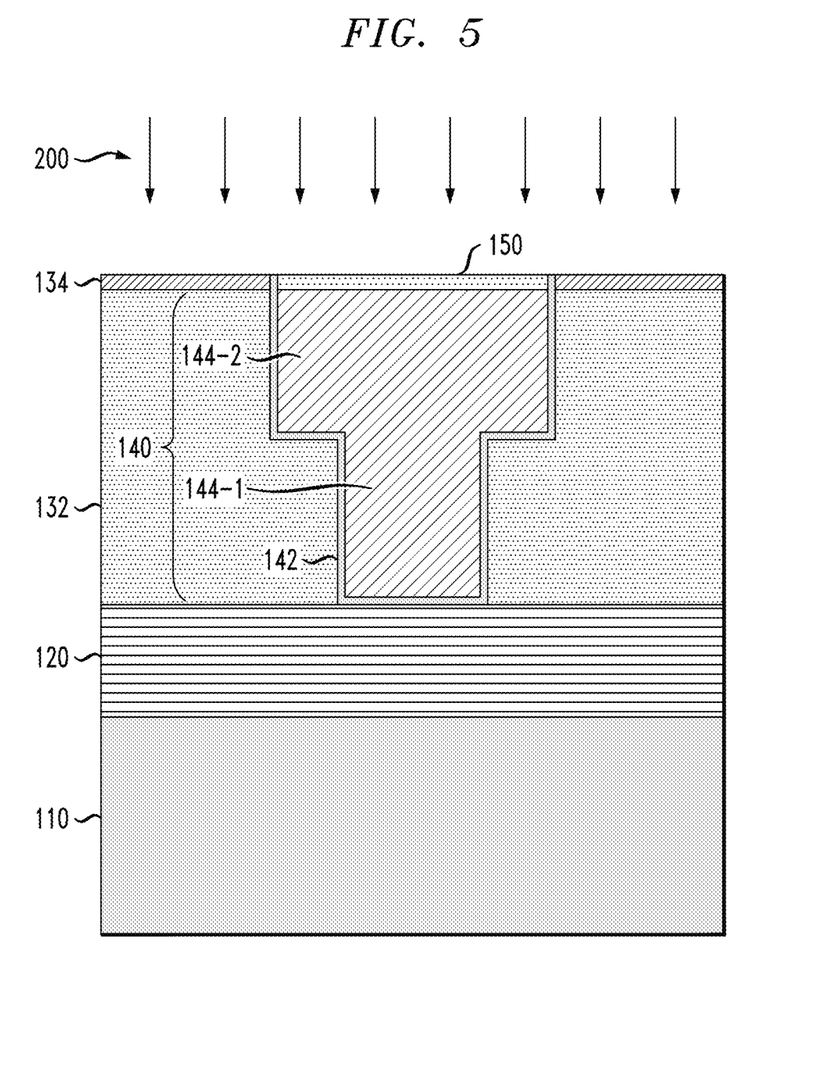
FIG. 5 is cross-sectional schematic side view of the semiconductor structure of FIG. 4, which shows a controlled surface treatment being applied to the surface of interlayer dielectric layer and the surface of the metal interconnect structure to densify the surface of the interlayer dielectric layer and to create point defects in the surface of the metal interconnect structure.

The controlled surface treatment 200 of FIG. 5 can be implemented using various plasma surface treatment methods. In general, for a plasma treatment process, a plasma can be generated using a precursor gas which comprises, but not limited to, Si, C, N, H, and/or O (e.g., $N_2$, $HH_3$, $H_2$, $N_2H_2$, or mixtures thereof, etc.) in an inert atmosphere of He or Ar. In addition, in one embodiment, the plasma treatment is performed in a suitable chamber at a temperature in a range of about 50 degrees Celsius to about 600 degrees Celsius, with a plasma energy that is suitable to perform the surface treatment to a target depth. More specifically, the controlled surface treatment 200 can be implemented using a gas cluster ion beam (GCIB) process, or a neutral atom beam (NAB) technique. In general, these surface treatment techniques involve a bombardment process in which the surface of the ILD layer 132 and the exposed surface of the metal interconnect structure 140 are bombarded with high energy particles to cause transformation of the dielectric and metallic materials as noted above. The GCIB and NAB treatment methods are technologies that enable nano-scale modification of surfaces, e.g., chemically alter surfaces through infusion.

In particular, with GCIB, the upper surfaces of the ILD layer 132 and metal interconnect structure 140 are bombarded by a beam of high energy nanoscale cluster ions, which are formed when a high pressure gas (e.g., 10 atmospheres pressure) expands into a vacuum. In one example embodiment, a GCIB treatment can be implemented with a suitable mixture of gases (as noted above), in a temperature range of about 50 degrees Celsius to about 600 degrees Celsius, and an energy in a range of about 10 keV to about 30 keV to chemically alter (e.g., densify) the upper surface of the ILD layer 132 through infusion of atoms at a controlled penetration depth of less than about 10 nm, and to create vacancy point defects in the upper surface of the metal interconnect structure 140.

Similarly, a NAB surface treatment enables ultra-shallow processing of surfaces by converting energized gas cluster ions produced by a GCIB method into intense collimated beams of coincident neutral gas atoms having controllable average energies from about 10 eV per atom to about 100 eV per atom. An electrostatic deflector is used to eliminate charged species in the environment, while allowing the released neutral atoms to bombard the target surface and produce effects similar to those normally associated with GCIB, but to shallower controlled penetration depths (e.g., about 3 nm or less).

In one embodiment of the invention, the controlled surface treatment 200 of FIG. 5 comprises a single surface treatment which is applied to concurrently form the point defect layer 150 in the exposed upper surface of the metal interconnect structure 140, and convert the upper surface (e.g., the damaged surface layer 132-1) of the ILD layer 132 into the densified surface layer 134 of the ILD layer 132. In another embodiment, the controlled surface treatment 200 of FIG. 5 may comprises two separate surface treatment processes, wherein one surface treatment is performed to densify the surface of the ILD layer 132, and another surface treatment is performed to form the point defect layer 150 in the upper surface of the metal interconnect structure 140.

Figure 6:
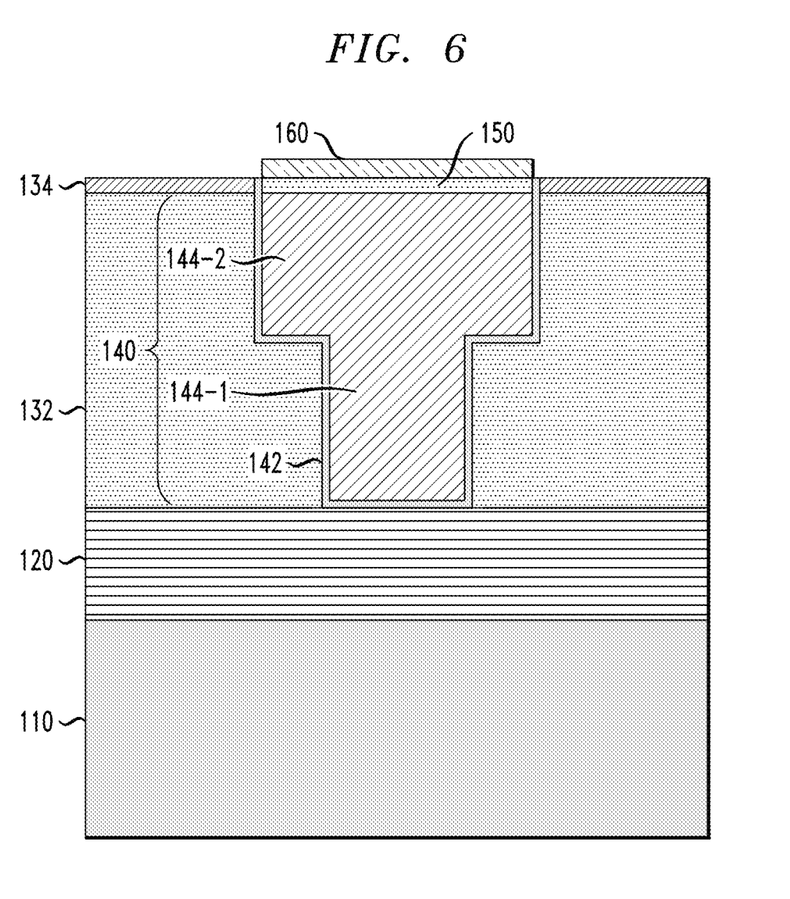
FIG. 6 is a cross-sectional schematic side view of the semiconductor structure of FIG. 5 after selectively forming a metallic capping layer on the surface of the metal interconnect structure.

Following completion of the controlled surface treatment 200, a layer of metallic material is deposited to form metal capping layers over the exposed surfaces of the metal interconnect structures formed in the ILD layer of the given BEOL interconnect level. For example, FIG. 6 is a cross-sectional schematic side view of the semiconductor structure of FIG. 5 after forming the metallic capping layer 160 on the upper surface of the metal interconnect structure 140. In particular, the metallic capping layer 160 is formed on the point defect layer 150 at the upper surface of the metal interconnect structure 140.

In one embodiment of the invention, the metallic capping layer 160 is formed by selectively depositing a layer of metallic material such that the metallic material is deposited on the upper surface of the metal interconnect structure 140 and not on the upper surface of the ILD layer 132. The metallic capping layer 160 can be formed with any suitable metallic material including, but not limited to, Co, Mn, Al, Ru, Ti, and Ni. The metallic capping layer 160 can be deposited selective to the metallic material (e.g., Cu) of the metal interconnect structure 140 using deposition techniques such as ALD, CVD, or electroless deposition.

Figure 7:
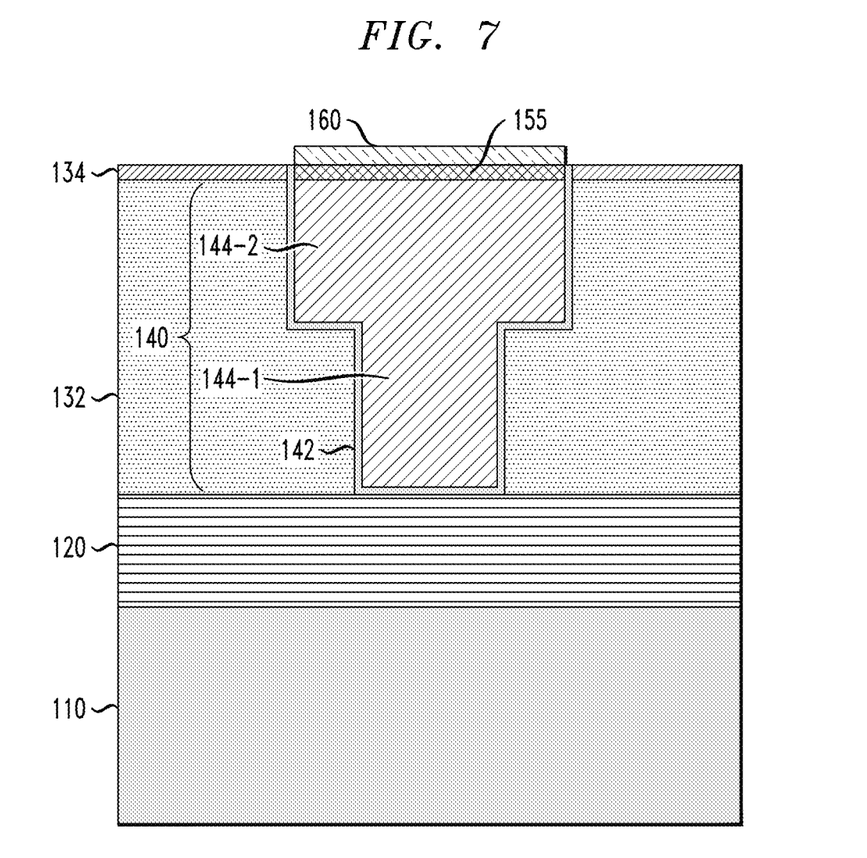
FIG. 7 is a cross-sectional schematic side view of the semiconductor structure of FIG. 6 after performing a thermal anneal process to form a metal alloy capping layer by infusion of atoms of the metallic capping layer into the point defect layer of the metal interconnect structure.

Following formation of the metallic capping layer 160, a thermal anneal process is performed at a suitable temperature and time duration to enable the metallic material of the metallic capping layer 160 to diffuse into the point defect layer 150 and convert the point defect layer 150 into a metal alloy capping layer which comprises an alloy of the metallic materials of the metallic capping layer 160 and the metal interconnect structure 140. For example, FIG. 7 is a cross-sectional schematic side view of the semiconductor structure of FIG. 6 after performing a thermal anneal process to form the metal alloy capping layer 155 as a result of the diffusion/infusion of atoms of the metallic capping layer 160 into the vacancies of the point defect layer 150 formed within the upper surface region of the metal interconnect structure 140. Essentially, the thermal anneal process results in the formation of a thin metal alloy capping layer (e.g., copper alloy layer) that is embedded in the upper surface region of the metal interconnect structure 140. The metal alloy capping layer 155 serves to provide enhanced resistance to electromigration, thus reducing the demand on the quality of the interface between the surfaces of the metal interconnect structure 140 and the metallic capping layer 160, which would be required in conventional designs.

Following formation of the metal alloy capping layer 155, in one embodiment of the invention, the metallic capping layer 160 can be removed using a selective etch process to remove the metallic capping layer 160 selective to the ILD layer 132 and the metal alloy capping layer 155, resulting in the semiconductor structure shown in FIG. 1. In another embodiment, the metallic capping layer 160 can remain as part of the BEOL interconnect structure 130. Thereafter, one or more additional BEOL interconnect levels can be formed over the first interconnect level of the semiconductor structure shown in FIG. 1 (without the metallic capping layer 160) or the semiconductor structure shown in FIG. 7 (with the metallic capping layer 160). The additional BEOL interconnect layers can be formed with metal interconnect structures having metal alloy capping layers formed as part of the upper surfaces of the metal interconnect structures using techniques as discussed herein.

Figure 8:
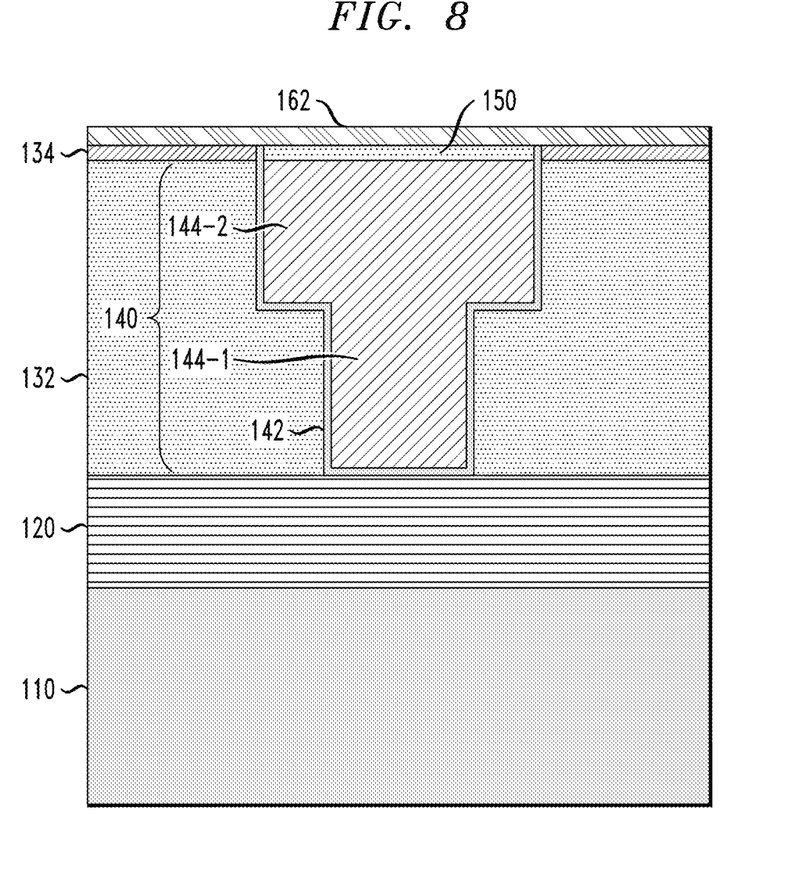
FIG. 8 is a cross-sectional schematic side view of the semiconductor structure of FIG. 5 after depositing a metallic capping layer over the surface of the semiconductor structure of FIG. 5.
Figure 9:
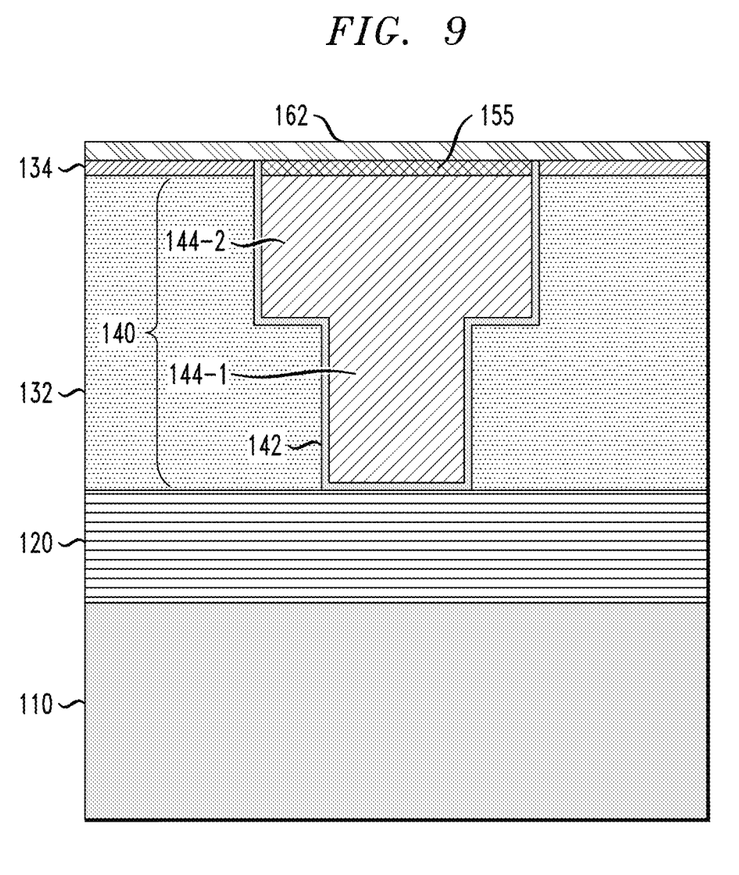
FIG. 9 is a cross-sectional schematic side view of the semiconductor structure of FIG. 8 after performing a thermal anneal process to form a metal alloy capping layer by infusion of atoms of the metallic capping layer into the point defects layer of the metal interconnect structure.

FIGS. 8 and 9 schematically illustrate a method for fabricating the semiconductor device 100 of FIG. 1, according to another embodiment of the invention. In particular, FIG. 8 is a cross-sectional schematic side view of the semiconductor structure of FIG. 5 after blanket depositing a metallic capping layer 162 over the entire surface of the semiconductor structure of FIG. 5. With this process, the metallic capping layer 162 is formed on the upper surface of the ILD layer 132 in addition to the upper surface of the metal interconnect structure 140 using a non-selective deposition process such as PVD, CVD or ALD. The metallic capping layer 162 can be formed of any metallic materials discussed above, e.g., Co, Mn, Al, Ru, Ti, and Ni.

Following formation of the metallic capping layer 162, a thermal anneal process is performed at a suitable temperature and time duration to enable the metallic material of the metallic capping layer 162 to diffuse into the point defect layer 150 and convert the point defect layer 150 into a metal alloy capping layer which comprises an alloy of the metallic materials of the metallic capping layer 162 and the metal interconnect structure 140. For example, FIG. 9 is a cross-sectional schematic side view of the semiconductor structure of FIG. 8 after performing a thermal anneal process to form the metal alloy capping layer 155 as a result of the diffusion/infusion of atoms of the metallic capping layer 162 into the vacancies of the point defect layer 150 of the metal interconnect structure 140. Essentially, the thermal anneal process results in the formation of a thin metal alloy capping layer (e.g., copper alloy layer) that is embedded in the upper surface region of the metal interconnect structure 140.

Following formation of the metal alloy capping layer 155 in FIG. 9, the protective capping layer 162 is removed using a selective etch process to remove the metal capping layer 162 selective to the ILD layer 132 and the metal alloy capping layer 155, resulting in the semiconductor structure shown in FIG. 1. Thereafter, one or more additional BEOL interconnect levels can be formed over the first interconnect level of the semiconductor structure shown in FIG. 1 (without the metallic capping layer 162), wherein the additional BEOL interconnect layers can be formed with metal interconnect structures having metal alloy capping layers formed as part of the upper surfaces of the metal interconnect structures using techniques as discussed herein.

In one embodiment of the invention, the point defect layer 150 that is formed by the controlled surface treatment 200 (FIG. 5) has a substantially uniform concentration of point defects (e.g., vacancies). In such instance, the metal alloy capping layer 155 that is formed (in FIGS. 7 and 9) will have a substantially uniform concentration proportion of the metallic materials of the metal interconnect structure 140 and the metallic capping layer 160 or 162. In another embodiment, a metal alloy capping layer is fabricated with a gradient alloy concentration profile, wherein the concentration proportion of the metallic materials of the metal alloy capping layer varies at different sublayers along a thickness of the metal alloy capping layer.

Figure 10:
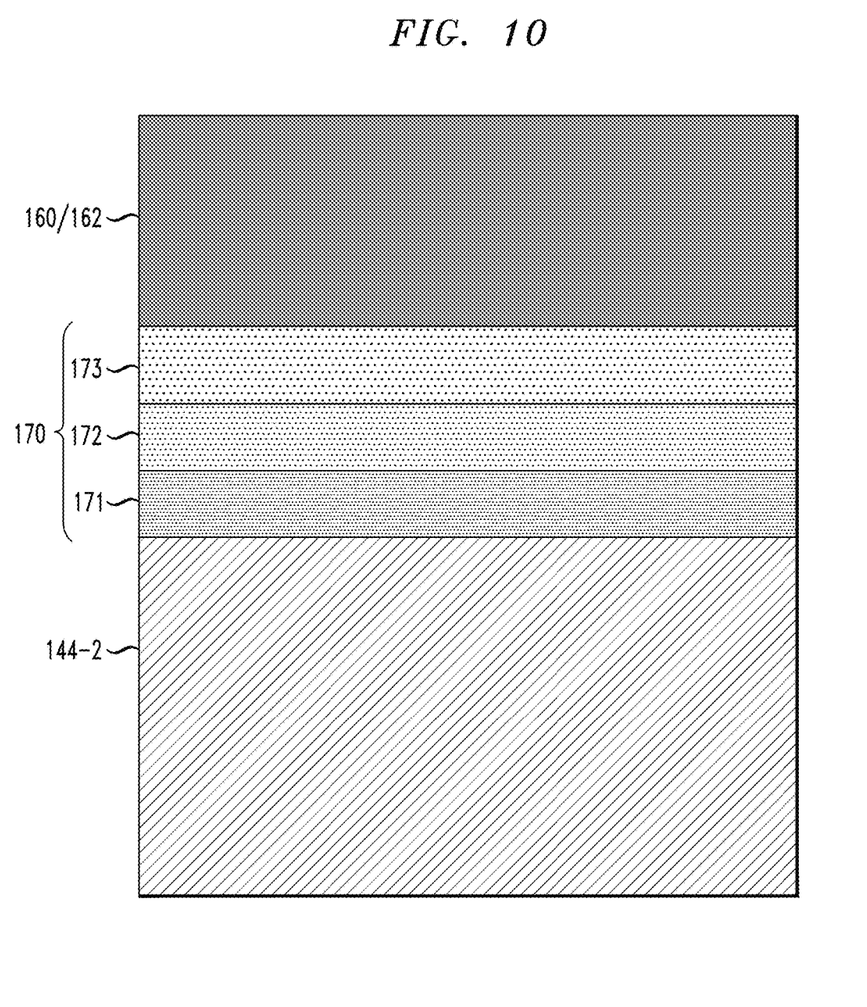
FIG. 10 schematically illustrates a method for fabricating a graded metal alloy capping layer on a metal interconnect structure according to another embodiment of the invention.

For example, FIG. 10 schematically illustrates a method for fabricating a graded metal alloy capping layer on a metal interconnect structure according to another embodiment of the invention. In particular, FIG. 10 schematically illustrates a stack structure comprising the metal wire 144-2 of the metal interconnect structure 140, a graded point defect layer 170, and the metallic capping layer (160 or 162). The graded point defect layer 170 is formed by treating an upper surface of the metal wire 144-2 using surface treatment methods as discussed above (FIG. 5) to create point defects in the upper surface of the metal wire 144-2. However, during the surface treatment, the power level of the process can be incrementally decreased to change the concentration of point defects (e.g., vacancies) at different levels along the thickness of the graded point defect layer 170.

For example, in the exemplary embodiment of FIG. 10, the graded point defect layer 170 comprises a plurality of point defect sublayers including a first point defect sublayer 171, a second point defect sublayer 172, and a third point defect sublayer 173, each of which have a different concentration of point defects (e.g., vacancies) generated by virtue of changing, in situ, the process parameters (e.g., power) of a controlled surface treatment process. For example, during an initial phase, the surface treatment can be performed at an initial power level (e.g., 100 watts) for a given period of time t (e.g., 2 seconds) to generate a first (uniform) concentration of point defects along the entire thickness of the point defect layer 170 (e.g., all sublayers 171, 172, 173), followed by a second phase in which the surface treatment is performed at a lower power level (e.g., 80 watts) for the same period of time t to generate more point defects in an upper portion (e.g., sublayers 172, 173) of the point defect layer 170, and followed by a third phase in which the surface treatment is performed at an even lower power level (e.g., 60 watts) for the same period of time t to generate even more point defects in a higher portion (e.g., sublayer 173) of the point defect layer 170.

With this example process, the deepest sublayer 171 will have the lowest concentration of point defects of the graded point defect layer 170, and the upper sublayer 173 will have the highest concentration of point defects of the graded point defect layer 170. The concentration of point defects of the intermediate sublayer 172 will be in between the point defect concentrations of the upper and lower sublayers 173 and 171. When a thermal anneal process is performed, the metallic material of the metal capping layer (160 or 162) will diffuse into the point defect vacancies in the different sublayers 171, 172 and 173 of the graded point defect layer 170 to generate a metal alloy capping layer with varying concentration proportions of the alloyed metals across the different sublayers 171, 172 and 173. For instance, assuming that the metal wire 144-2 is formed of copper, the concentration proportion of copper along the sublayers 171-172-173 decreases, while the concentration proportion of the metallic material of the metallic capping layer (160 or 162) along the sublayers 171-172-173 increases.

It is to be understood that the methods discussed herein for fabricating metal alloy capping layers in BEOL layers can be incorporated within semiconductor processing flows for fabricating other types of semiconductor devices and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

I claim:
1. A method, comprising:
    forming metal interconnect structure in a dielectric layer, wherein the metal interconnect structure comprises a first metallic material;
    applying a surface treatment to a surface of the metal interconnect structure to form a point defect layer in the surface of the metal interconnect structure;

forming a metallic capping layer on the point defect layer of the metal interconnect structure, wherein the metallic capping layer comprises a second metallic material; and performing a thermal anneal process to convert the point defect layer into a metal alloy capping layer, wherein the metal alloy capping layer comprises an alloy of the first metallic material and the second metallic material.

2. The method of claim 1, further comprising removing the metallic capping layer.

3. The method of claim 1, wherein the first metallic material comprises copper.

4. The method of claim 1, wherein the second metallic material comprises at least one Co, Mn, Al, Ru, Ti, and Ni.

5. The method of claim 1, wherein the metal interconnect structure and the dielectric layer comprise an interconnect level of a BEOL (back end of line) structure of a semiconductor device.

6. The method of claim 1, wherein the point defect layer is formed with a thickness in a range of about 1 nm to about 3 nm.

7. The method of claim 1, wherein the point defect layer comprises a substantially uniform concentration of point defects in the surface of the metal interconnect structure.

8. The method of claim 1, wherein the point defect layer comprises a graded concentration of point defects in the surface of the metal interconnect structure.

9. The method of claim 1, wherein the surface treatment is performed using at least one of a gas cluster ion beam (GCIB) process, and a neutral atom beam (NAB) process.

10. The method of claim 1, wherein the metal alloy capping layer comprises a substantially uniform concentration proportion of the first metallic material and the second metallic material.

11. The method of claim 1, wherein the metal alloy capping layer comprises a graded concentration proportion of the first metallic material and the second metallic material.

12. The method of claim 1, further comprising applying a surface treatment to a surface of the dielectric layer to form a densified surface layer in an upper portion of the dielectric layer.

13. The method of claim 12, wherein the densified surface layer has thickness in a range of about 1 nm to about 3 nm.

14. The method of claim 12, wherein applying a surface treatment to a surface of the dielectric layer comprises converting a damaged surface layer of the dielectric layer into the densified surface layer by infusing atoms into the damaged surface layer of the dielectric layer.

15. The method of claim 14, wherein the infused atoms comprise at least one of Si, C, N, H, and O atoms.

16. A method, comprising:

forming metal interconnect structure in a dielectric layer, wherein the metal interconnect structure comprises a first metallic material;

applying a single surface treatment to a surface of the metal interconnect structure and a surface of the dielectric layer to form a point defect layer in the surface of the metal interconnect structure and to densify the surface of the dielectric layer;

forming a metallic capping layer on the point defect layer of the metal interconnect structure, wherein the metallic capping layer comprises a second metallic material; and performing a thermal anneal process to convert the point defect layer into a metal alloy capping layer, wherein the metal alloy capping layer comprises an alloy of the first metallic material and the second metallic material.

* * * * *